United States Patent
Bush et al.

(10) Patent No.: US 9,268,000 B2
(45) Date of Patent: Feb. 23, 2016

(54) SYSTEM AND METHOD FOR IMPROVED ACCURACY IN BATTERY RESISTANCE MEASUREMENT SYSTEMS

(71) Applicant: Liebert Corporation, Columbus, OH (US)

(72) Inventors: Terry D. Bush, Westerville, OH (US); Brian Cogar, Mansfield, OH (US); Russell E. Shetler, Jr., Delaware, OH (US); Charles O'Donnell, Westerville, OH (US)

(73) Assignee: Liebert Corporation, Columbus, OH (US)

( * ) Notice: Subject to any disclaimer, the term of this patent is extended or adjusted under 35 U.S.C. 154(b) by 184 days.

(21) Appl. No.: 14/191,701

(22) Filed: Feb. 27, 2014

(65) Prior Publication Data

US 2014/0266224 A1    Sep. 18, 2014

Related U.S. Application Data

(60) Provisional application No. 61/781,393, filed on Mar. 14, 2013.

(51) Int. Cl.
*G01N 27/416* (2006.01)
*G01R 31/36* (2006.01)
(Continued)

(52) U.S. Cl.
CPC ............ *G01R 31/3662* (2013.01); *G01R 31/42* (2013.01); *G01R 31/005* (2013.01); *G01R 31/362* (2013.01); *G01R 31/3627* (2013.01)

(58) Field of Classification Search
CPC .............. Y02E 60/12; G01R 31/3658; G01R 31/3648; G01R 31/3627; G01R 31/3662; G01R 31/3631; G01R 19/16585; H02J 7/0021; H02J 7/0016; Y02T 10/7055
USPC .......................................................... 324/426
See application file for complete search history.

(56) References Cited

U.S. PATENT DOCUMENTS 4,259,639 A * 3/1981 Renirie ................ A61N 1/3708
324/426
6,332,113 B1   12/2001 Bertness
(Continued)

FOREIGN PATENT DOCUMENTS

CN      102879744 A    1/2013
EP       2693228 A1    2/2014
(Continued)

OTHER PUBLICATIONS

Combined Search and Examination Report for corresponding UK application No. GB1404018.2 dated Sep. 10, 2014, 7 pages.
(Continued)

*Primary Examiner* — Arun Williams
(74) *Attorney, Agent, or Firm* — Harness, Dickey & Pierce, P.L.C.

(57) ABSTRACT

A method is disclosed for reducing an influence of voltage ripple on battery test measurements of battery cells coupled in series that form a direct current (DC) bus. A calibration operation is used to obtain a ratiometric difference between first and second series connected battery cells of the DC bus, which is indicative of a variance in their respective output voltages. Voltage measurements across each of the two cells may then be obtained at least substantially simultaneously. The ratiometric difference may be used to modify the voltage measurement taken across the second cell to produce a modified voltage measurement of the second cell. A difference between the measured voltage across the first battery cell and the modified voltage measurement may then be determined, which represents a filtered DC test voltage that has substantially all of the voltage ripple removed therefrom.

16 Claims, 4 Drawing Sheets

(51) Int. Cl.
*G01R 31/42* (2006.01)
*G01R 31/00* (2006.01)

(56) References Cited

U.S. PATENT DOCUMENTS

| | | | |
|---|---|---|---|
| 6,417,646 B1 | 7/2002 | Huykman et al. | |
| 6,534,993 B2 | 3/2003 | Bertness | |
| 6,812,674 B2 | 11/2004 | Hoffman | |
| 7,567,085 B2 | 7/2009 | Kim et al. | |
| 7,710,119 B2 | 5/2010 | Bertness | |
| 8,035,396 B2 | 10/2011 | Kim | |
| 8,063,643 B2 | 11/2011 | Deveau et al. | |
| 8,131,487 B2 | 3/2012 | Thibedeau et al. | |
| 2005/0101263 A1* | 5/2005 | Kim | H04W 52/08 455/78 |
| 2006/0244423 A1* | 11/2006 | Henningson | G01R 31/3631 320/150 |
| 2011/0101986 A1 | 5/2011 | Shen et al. | |
| 2012/0119745 A1 | 5/2012 | Deveau et al. | |
| 2013/0103332 A1 | 4/2013 | Chen et al. | |
| 2014/0091783 A1 | 4/2014 | Cotton et al. | |
| 2014/0225622 A1* | 8/2014 | Kudo | B60L 3/0046 324/433 |

FOREIGN PATENT DOCUMENTS

| | | |
|---|---|---|
| GB | 1514182 A | 6/1978 |
| JP | 2003243042 A | 8/2003 |
| WO | 2005054879 A1 | 6/2005 |

OTHER PUBLICATIONS

Cellcorder—The Resistance Tester CRT-400; http://www.alber.com/ Brochures, 2 pages, at least one day prior to Mar. 14, 2013.

Albercorp. "Predicting Battery Performance Using Internal Cell Resistance," 7 pages, at least one day prior to Mar. 14, 2013.

Schweiger, Hans-Georg et al. "Comparison of Several Methods for Determining the Internal Resistance of Lithium Ion Cells," Sensors, No. 10, pp. 5604-5625, 2010.

* cited by examiner

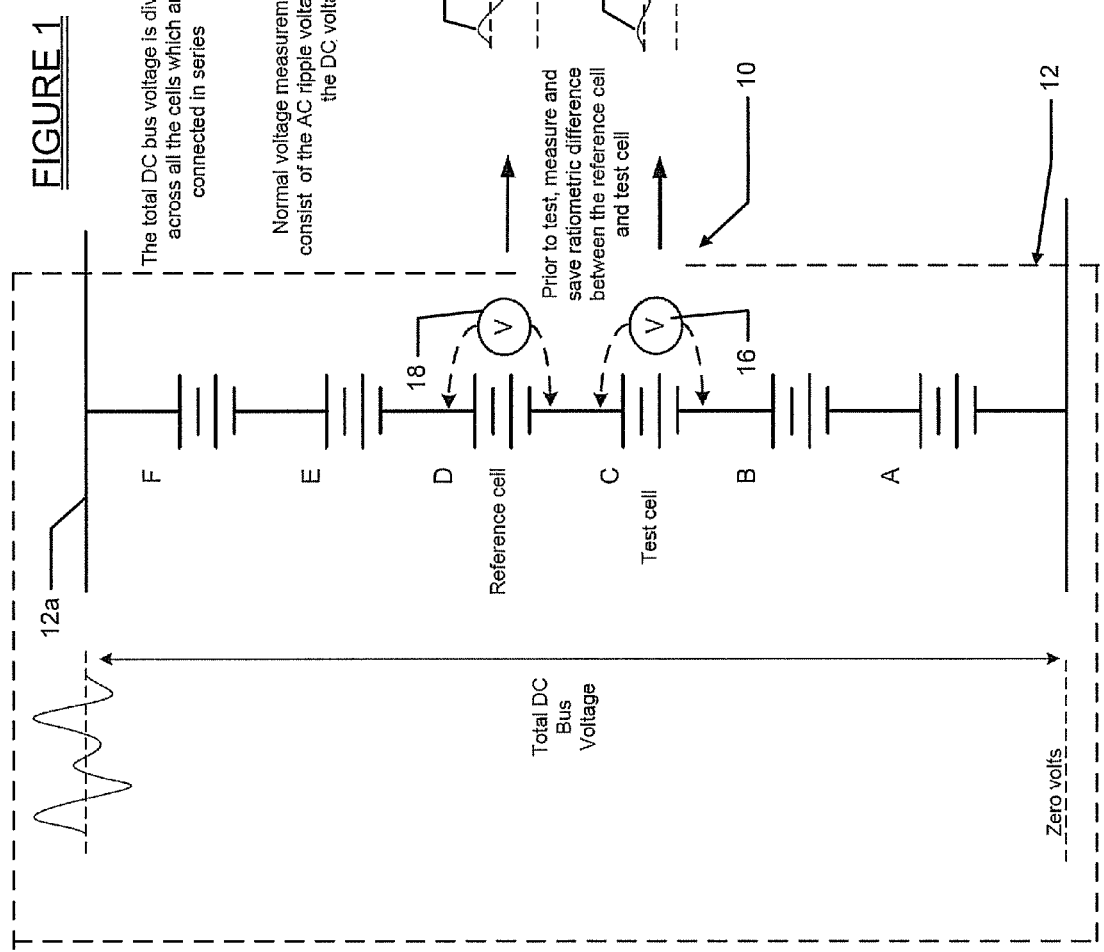

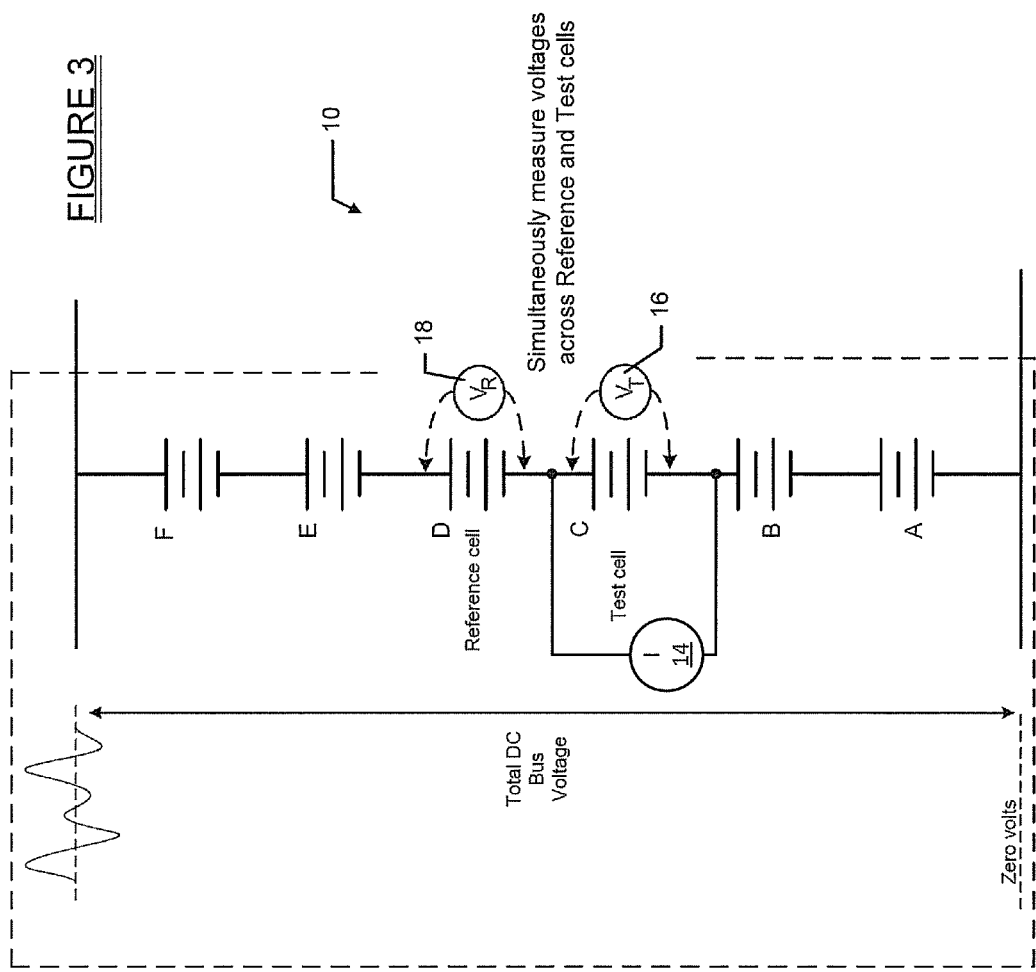

SYSTEM AND METHOD FOR IMPROVED ACCURACY IN BATTERY RESISTANCE MEASUREMENT SYSTEMS

CROSS-REFERENCE TO RELATED APPLICATIONS

This application claims the benefit of U.S. Provisional Application No. 61/781,393, filed on Mar. 14, 2013. The entire disclosure of the above application is incorporated herein by reference.

FIELD

The present disclosure relates to systems and methods for testing batteries used in uninterruptible power supply systems, and more particularly for a system and method that is able to even more accurately measure an internal battery resistance of each cell of an uninterruptible power supply.

BACKGROUND

This section provides background information related to the present disclosure which is not necessarily prior art.

Battery cell internal resistance is an indication of battery cell health. Battery monitoring systems often used in uninterruptible power supply ("UPS") systems may determine individual cell internal resistance by periodically injecting a pulse of DC current through the cell and measuring the DC voltage developed across the cell during the current pulse test. This voltage is compared to the normal DC voltage across the cell to derive the cell internal resistance. However, the AC ripple voltage inherently present on an uninterruptible power supply ("UPS") system DC bus creates error in the test voltage measurements and therefore errors in the internal resistance calculation. Voltage ripple is introduced onto the front end of a UPS DC bus by rectification circuits of the UPS which apply current pulses from an upstream power source to maintain the DC bus voltage at the desired potential for proper UPS operation and to keep the battery cells of the UPS in a fully charged state. Voltage ripple is also introduced onto the DC bus by inverter circuits of the UPS which extract current pulses from the DC bus in the process of supplying power to the UPS load. The UPS DC bus ripple voltage signals may be random and are in the approximate amplitude and frequency range of the voltage signals generated by the battery cell test. The voltage ripple signals can create a signal-to-noise ratio concern with respect to the voltage measurements being taken. This can make it virtually impossible to effectively filter the AC ripple voltage from the desired DC voltage signal generated by the battery cell test.

SUMMARY

This section provides a general summary of the disclosure, and is not a comprehensive disclosure of its full scope or all of its features.

In one aspect the present disclosure provides a method for at least substantially reducing an influence of voltage ripple on battery test measurements of battery cells coupled in series that form a direct current (DC) bus. The method may comprise performing a calibration operation to obtain a ratiometric difference between a first battery cell of the DC bus and a second battery cell of the DC bus, where the first and second battery cells are connected in series and have differing characteristics which introduce a variance in their respective output voltages. The method may also involve applying a current signal to the first battery cell and measuring a voltage across the first battery cell and at least substantially simultaneously measuring a voltage across the second battery cell. The ratiometric difference may be used to modify the voltage measurement taken across the second battery cell, to produce a modified voltage measurement of the second battery cell. The measured voltage across the first battery cell and the modified voltage measurement across the second battery cell may then be used to determine a difference therebetween, the difference representing a filtered DC test voltage that has substantially all of the voltage ripple removed therefrom.

In another aspect the present disclosure relates to a method for at least substantially reducing an influence of voltage ripple on battery test measurements of battery cells coupled in series that form a direct current (DC) bus. The method may comprise performing a calibration operation by initially obtaining a first voltage measurement across a first battery cell of the DC bus, the first battery cell forming a battery cell under test, and at least substantially simultaneously obtaining a second voltage measurement across a second battery cell of the DC bus which is connected in series with the first battery cell. The second battery cell may form a reference battery cell. The first and second voltage test measurements may be used to determine a ratiometric difference between the first and second battery cells. The ratiometric difference may represent a variance between outputs of the first and second battery cells due to mechanical and chemical characteristics. A current signal may then be applied to the first battery cell and a voltage across the first battery cell may be measured. A voltage across the second battery cell may also be measured. The determined ratiometric difference may be used to modify the voltage measurement taken across the second battery cell, to thus produce a modified voltage measurement of the second battery cell. The measured voltage across the first battery cell and the modified voltage measurement across the second battery cell may then be used to determine a difference therebetween. The difference may represent a filtered DC test voltage that has substantially all of the voltage ripple removed therefrom.

In still another aspect the present disclosure relates to a system for at least substantially reducing an influence of voltage ripple on battery test measurements of battery cells coupled in series that form a direct current (DC) bus. The system may comprise a processor controlled data acquisition system having at least one volt meter, the processor controlled data acquisition system being configured to obtain a first voltage measurement across a first battery cell of the DC bus, where the first battery cell forms a battery cell under test. A second voltage measurement across a second battery cell of the DC bus, which is connected in series with the first battery cell, may also be obtained at least substantially simultaneously with the first voltage measurement. The second battery cell forms a reference battery cell. The first and second voltage test measurements may then be used in a calibration operation to determine a ratiometric difference between the first and second battery cells. The ratiometric difference may represent a variance between outputs of the first and second battery cells due to at least one of mechanical or chemical characteristics. A current source may be used for injecting a current signal to the first battery cell and using the at least one volt meter to obtain a voltage across the first battery cell and a voltage across the second battery cell. The data acquisition subsystem may be further configured to use the determined ratiometric difference to modify the voltage measurement taken across the second battery cell, to produce a modified voltage measurement of the second battery cell. The measured voltage across the first battery cell and the modified voltage measurement across the second battery cell may then be used to determine a difference therebetween. The difference may represent a filtered DC test voltage that has substantially all of the voltage ripple removed therefrom.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure. Corresponding reference numerals indicate corresponding parts throughout the several views of the drawings. In the Figures:

FIG. 1 is a high level schematic diagram of a portion of a UPS system with six battery cells in one string illustrating how measurement equipment may be electrically coupled to various ones of the cells to carry out the voltage measurements required to determine internal battery resistance of a selected cell;

FIGS. 2a and 2b show the same AC voltage ripple signal component present in the DC voltages of the test cell and the reference cell obtained during a calibration phase;

FIG. 3 shows the circuit of FIG. 1 but with a current source connected across the cell under test to apply a current pulse during an active test phase;

Figure 5:
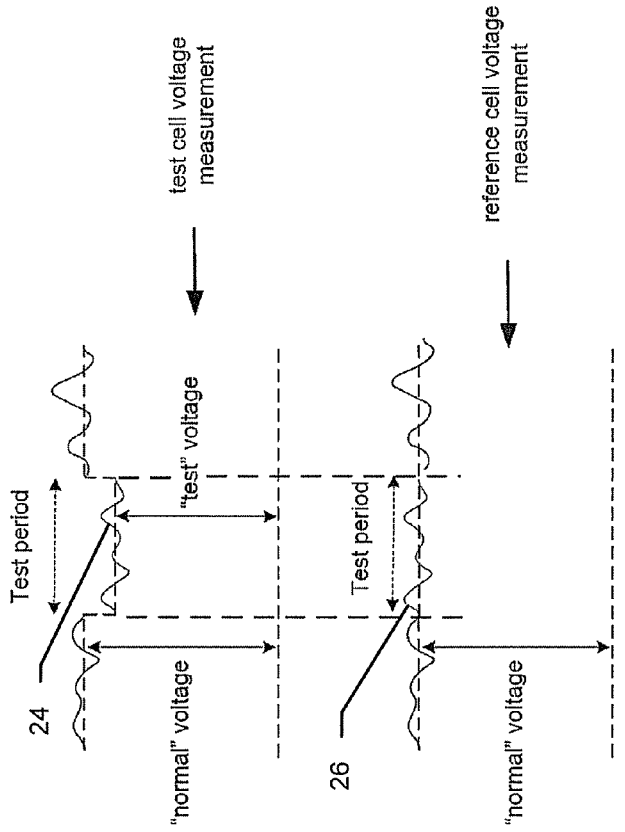
Figure 6:
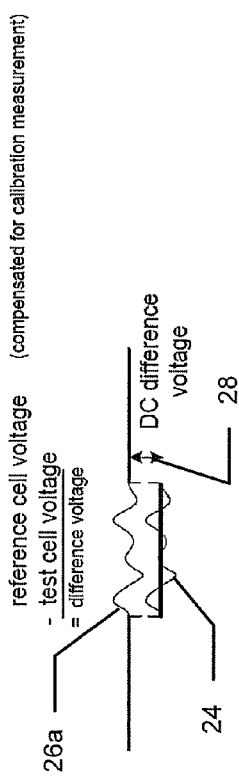

FIG. 5 shows the output voltage waveforms obtained across the test cell and reference cells, respectively, during the active test phase, and further illustrates how the DC voltage ripple component is aligned in time in the two waveforms; and FIG. 6 is an illustration showing the magnitude difference between the calibrated reference voltage and the voltage of the cell under test, with the "DC voltage difference" representing a highly accurate voltage measurement that may be used in determining the internal resistance for the cell under test.

DETAILED DESCRIPTION

Example embodiments will now be described more fully with reference to the accompanying drawings.

Referring to FIG. 1 there is shown a system 10 for reducing or eliminating the effect of voltage ripple when taking battery cell measurements on a UPS 12, for the purpose of determining the internal resistance of a given battery cell of the UPS. The UPS 12 in this example is shown in highly simplified form having six individual battery cells labeled "A" through "F" connected across a DC bus 12a of the UPS. In this example the cells A-F form one battery cell "string" of the UPS 12. A "test" volt meter 16 is used to obtain voltage measurements across a "cell under test", which in this example is cell C. A second voltmeter 18, which will be referred to as a "reference" volt meter, is used to obtain a voltage across one of the other battery cells in the string, which in this example is battery cell D.

A calibration phase may initially be performed to determine a ratiometric difference between the battery cell under test and the reference battery cell. The volt meters 16 and 18 are configured for this operation in FIG. 1. Determining the ratiometric difference between the two battery cells C and D is useful because the voltage across each of the cells A-F will not necessarily be the same. This is because no two ones of the battery cells A-F will typically have perfectly identical mechanical and chemical characteristics. In addition, the battery cells A-F may have different charge states due to aging, temperature or other factors. All of these factors combined often result in slight differences between the output voltages of the battery cells A-F. The calibration phase identifies a precise ratio or percentage difference (i.e., the ratiometric difference) at a specific time between the reference cell and the cell under test. This will be described further in connection with the flowchart of FIG. 4.

FIGS. 2a and 2b provide examples of voltage waveforms that may be obtained using the volt meters 16 and 18 during the calibration phase of testing. As noted above, there will often be a small degree of AC voltage ripple present on the DC bus 12a. This AC voltage ripple can influence the accuracy of the desired DC voltage measurement obtained for the battery cell under test. FIG. 2a illustrates a waveform 20 representing a voltage measurement taken across the cell under test (cell C). FIG. 2b illustrates a waveform 22 taken across the reference cell (cell D). The measurements producing the waveforms 20 and 22 in this example were taken simultaneously using the volt meters 16 and 18, respectively. It can be seen that the voltage ripple is superimposed on the DC voltages of both waveforms 20 and 22, although it is of greater magnitude on the waveform 22 taken across the reference cell D.

Referring to FIG. 3, once the calibration operation is performed, then an active measurement phase may be carried out. The active measurement phase includes using a current source 14 for applying a pulse of current sufficient in amplitude to develop a measurable voltage across the cell resistance of the cell under test, which in this instance is battery cell C. Volt meter 16 has its test leads placed across the positive and negative terminals of the battery cell C. The volt meter 18 is used to obtain the reference voltage and thus has its leads connected to the positive and negative terminals of the reference cell D.

The system 10 takes advantage of the fact that any amount of voltage ripple that is present on the DC bus will be divided approximately equally across all the cells in the DC bus 12a, and thus the voltage across the battery cell C, will also be present across each of the battery cells A-F. Although the AC voltage ripple can adversely affect voltage measurement readings taken for the cell under test (cell C), the method of the present disclosure uses the known existence of the AC voltage ripple to help eliminate it from the voltage test measurement taken for battery cell C.

Figure 4:
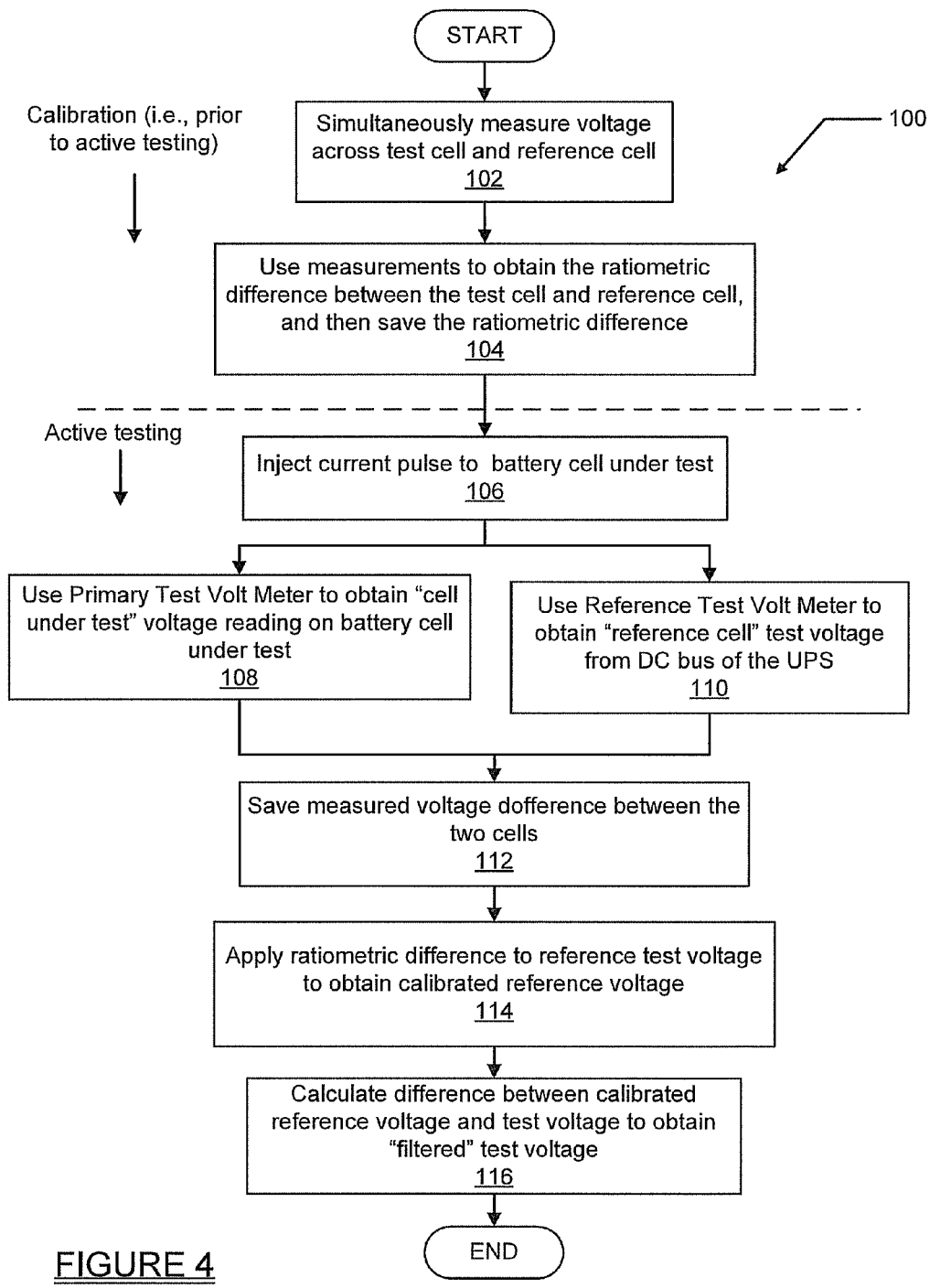
FIG. 4 is a flowchart of various operations that may be performed using the system of FIG. 3 to make a voltage measurement across a specific battery cell for the purpose of determining the internal battery resistance of the specific cell.

With reference to FIG. 4, a flowchart 100 is shown illustrating one example of a sequence of operations that may be performed in accordance with the methodology of the present disclosure in carrying out the calibration and active measurement phases of the present disclosure. Operations 102 and 104 are performed for the calibration phase of the methodology. At operation 102 the voltage across the cell under test (cell C) and the voltage across the reference cell (cell D) are measured using the volt meters 16 and 18, respectively (FIG. 3). These measurements are carried out simultaneously, for example by suitable processor controlled data acquisition equipment. At operation 104 the measurements obtained at operation 102 are used to determine the ratiometric difference between the voltages of the test cell and the reference cell.

At operation 106 the active phase of the testing begins. Operation 106 involves injecting a current pulse from the current source 14 into the battery cell under test (cell C). In practice this may be a negative current pulse which loads the cell under test. Simultaneously, or substantially simultaneously, the battery cell under test volt meter 16 is used to obtain a voltage reading across the battery cell under test (cell C), as indicated at operation 108, while the reference volt meter 18 is used to obtain a measurement of the voltage across the reference battery cell (cell D), as indicated at operation 110. With brief reference to FIG. 5, waveform 24 represents the voltage of the battery cell under test (cell C) while waveform 26 represents the voltage of the reference cell (cell D). It will be noted that the two waveforms 24 and 26 are essentially perfectly aligned in time.

Once the two measured voltages obtained at operations 108 and 110 are obtained they may then be saved, as indicated at operation 112. At operation 114 the ratiometric difference obtained at operations 102 and 104 is used to modify the just-obtained reference voltage to create a "calibrated" reference voltage. For example, if the ratiometric difference indicated that the reference cell voltage was 15% greater than the cell under test, then the value of the reference voltage obtained at operation 110 would be reduced by 15% to form the calibrated reference voltage. At operation 116 the difference between the calibrated reference voltage and the voltage obtained from the battery cell under test (cell C) is determined. This operation involves subtracting one from the other to obtain the difference between the two. FIG. 6 illustrates a DC difference voltage 28 between the calibrated reference voltage waveform 26a and the test voltage waveform 24. The resulting DC difference voltage 28 may be thought of as a "filtered" DC test voltage for the batter cell under test. The filtered DC test voltage has the AC voltage ripple component fully removed. Accordingly, the filtered DC test voltage can be used to make a highly accurate approximation of the internal resistance of the battery cell under test. In practice the method 100 enables 100% or virtually near 100% of the AC voltage ripple component to be filtered from the test voltage measurement being made on the battery cell under test. If needed, well known cross correlation techniques could be employed to address any error that would result from slight measurement time skew between the reference and test voltages. In addition, any error that would result from measurement accuracy of the two volt meters can be addressed by alternately exchanging the two volt meters on two successive tests and averaging the measurement difference for each cell thus nulling out any volt meter accuracy error.

The present disclosure is therefore able to provide highly accurate DC voltage measurements that enable battery internal resistance determinations to be reliably and accurately made. The system and method of the present disclosure does not rely on the need for complicated filtering systems; existing data acquisition equipment is readily available that is able to perform the needed measurements.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for at least substantially reducing an influence of voltage ripple on battery test measurements of battery cells coupled in series that form a direct current (DC) bus, the method comprising:
   performing a calibration operation to obtain a ratiometric difference between a first battery cell of the DC bus and a second battery cell of the DC bus, where the first and second battery cells are connected in series and have differing characteristics which introduce a variance in their respective output voltages;
   applying a current signal to the first battery cell and at least substantially simultaneously measuring a voltage across the first battery cell and a voltage across the second battery cell;
   using the determined ratiometric difference to modify the voltage measurement taken across the second battery cell, to produce a modified voltage measurement of the second battery cell; and
   using the measured voltage across the first battery cell and the modified voltage measurement across the second battery cell to determine a difference therebetween, the difference representing a filtered DC test voltage that has substantially all of the voltage ripple removed therefrom.

2. The method of claim 1, wherein obtaining the ratiometric difference comprises:
   obtaining a first voltage measurement across the first battery cell of the DC bus, the first battery cell forming a battery cell under test; and
   at least substantially simultaneously obtaining a second voltage measurement across a second battery cell of the DC bus which is connected in series with the first battery cell, the second battery cell forming a reference battery cell test.

3. The method of claim 2, wherein obtaining the ratiometric difference further comprises using the at least substantially simultaneously obtained first and second voltage test measurements to determine a difference in magnitude of output voltages between the first and second battery cells, the ratiometric difference representing a variance in the output voltages of the first and second battery cells due to mechanical or chemical characteristics.

4. The method of claim 1, wherein the using the determined ratiometric difference to modify the voltage measurement taken across the second battery cell, to produce a modified voltage measurement of the second battery cell, comprises one of adding to, or subtracting from, the voltage measurement taken across the second battery cell, to produce the modified voltage measurement.

5. The method of claim 1, wherein the operation of using the measured voltage across the first battery cell and the modified voltage measurement across the second battery cell to determine a difference therebetween involves subtracting one of the measured voltage across the first battery cell or the modified voltage measurement from the other.

6. A method for at least substantially reducing an influence of voltage ripple on battery test measurements of battery cells coupled in series that form a direct current (DC) bus, the method comprising:
   performing a calibration operation by:
      obtaining a first voltage measurement across a first battery cell of the DC bus, the first battery cell forming a battery cell under test;
      at least substantially simultaneously obtaining a second voltage measurement across a second battery cell of the DC bus which is connected in series with the first battery cell, the second battery cell forming a reference battery cell;
   using the first and second voltage test measurements to determine a ratiometric difference between the first and second battery cells, the ratiometric difference representing a variance between outputs of the first and second battery cells due to at least one of mechanical and chemical characteristics of the first and second battery cells;
   applying a current signal to the first battery cell and measuring a voltage across the first battery cell and a voltage across the second battery cell, at least substantially simultaneously with the voltage measured across the first battery cell;
   using the determined ratiometric difference to modify the voltage measurement taken across the second battery cell, to produce a modified voltage measurement of the second battery cell; and
   using the measured voltage across the first battery cell and the modified voltage measurement across the second battery cell to determine a difference therebetween, the difference representing a filtered DC test voltage that has substantially all of the voltage ripple removed therefrom.

7. The method of claim 6, wherein the operation of using the ratiometric difference to modify the voltage measurement taken of the second battery cell to obtain a modified voltage measurement across the second battery cell comprises one of adding or subtracting a voltage value in accordance with the ratiometric difference to the voltage measurement taken across the second battery cell, to produce the modified voltage measurement.

8. The method of claim 6, wherein the operation of using the measured voltage across the first battery cell and the modified voltage measurement across the second battery cell to determine a difference therebetween involves subtracting one of the measured voltage across the first battery cell, or the modified voltage measurement, from the other.

9. The method of claim 8, further comprising using a processor to help obtain the measured voltage across the first battery cell and the voltage measurement of the second battery cell.

10. The method of claim 6, wherein the applying a current signal comprises applying a current pulse to the first battery cell.

11. The method of claim 6, wherein the performing a calibration operation by obtaining a first voltage measurement across a first battery cell of the DC bus, the first battery cell forming a battery cell under test, and obtaining a second voltage measurement across a second battery cell of the DC bus which is connected in series with the first battery cell, the second battery cell forming a reference battery cell test, comprises obtaining the first and second battery voltage measurements simultaneously.

12. The method of claim 6, wherein the applying a current signal to the first battery cell and measuring a voltage across the first battery cell and a voltage across the second battery cell comprises performing the measurements of the voltage across the first battery cell and across the second battery cell simultaneously.

13. A system for at least substantially reducing an influence of voltage ripple on battery test measurements of battery cells coupled in series that form a direct current (DC) bus, the system comprising:

a processor controlled data acquisition system having at least one volt meter, the processor controlled data acquisition system being configured to:
  obtain a first voltage measurement across a first battery cell of the DC bus, the first battery cell forming a battery cell under test;
  at least substantially simultaneously obtain a second voltage measurement across a second battery cell of the DC bus which is connected in series with the first battery cell, the second battery cell forming a reference battery cell;
  use the first and second voltage measurements in a calibration operation to determine a ratiometric difference between the first and second battery cells, the ratiometric difference representing a variance between outputs of the first and second battery cells due to at least one of mechanical or chemical characteristics; and
a current source for injecting a current signal into the first battery cell and using the at least one volt meter to measure a voltage across the first battery cell, and a voltage across the second battery cell at least substantially simultaneously with the voltage measured across the first battery cell;
the data acquisition subsystem further configured to:
  use the determined ratiometric difference to modify the voltage measurement taken across the second battery cell, to produce a modified voltage measurement of the second battery cell; and
  use the measured voltage across the first battery cell and the modified voltage measurement across the second battery cell to determine a difference therebetween, the difference representing a filtered DC test voltage that has substantially all of the voltage ripple removed therefrom.

14. The system of claim 13, wherein the determined ratiometric difference is obtained by one of adding to, or subtracting from, the voltage measurement taken across the second battery cell, to produce the modified voltage measurement.

15. The system of claim 13, wherein the calibration comprises obtaining the first and second battery voltage measurements simultaneously.

16. The system of claim 13, wherein the current source comprises a current source configured to inject a current pulse into the first battery cell.

* * * * *